(12) United States Patent
Choi et al.

(10) Patent No.: US 6,894,924 B2
(45) Date of Patent: May 17, 2005

(54) OPERATING A NON-VOLATILE MEMORY DEVICE

(75) Inventors: Jung-Dal Choi, Kyunggi-do (KR); Chang-Hyun Lee, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 363 days.

(21) Appl. No.: 10/133,684

(22) Filed: Apr. 25, 2002

(65) Prior Publication Data

US 2003/0081460 A1 May 1, 2003

(30) Foreign Application Priority Data

Oct. 22, 2001 (KR) ........................................ 2001-65030

(51) Int. Cl.$^7$ .............................................. G11C 16/04
(52) U.S. Cl. ........................... 365/185.01; 365/185.17; 365/185.18; 365/185.29
(58) Field of Search ....................... 365/185.01, 185.17, 365/185.18, 185.29

(56) References Cited

U.S. PATENT DOCUMENTS 6,122,191 A * 9/2000 Hirose et al. .......... 365/185.01
6,597,604 B2 * 7/2003 Yi et al. ................. 365/185.29

FOREIGN PATENT DOCUMENTS

JP 10-065029 3/1998
JP 11-126494 11/1999

OTHER PUBLICATIONS

English language Abstract from Japanese Patent Publication No. 10-065029.
English language Abstract from Japanese Patent Publication No. 11-126494.

* cited by examiner

*Primary Examiner*—Trong Phan
(74) *Attorney, Agent, or Firm*—Marger Johnson & McCollom, P.C.

(57) ABSTRACT

An operation method of programming, erasing, and reading a silicon-oxide-nitride-oxide-silicon (SONOS) non-volatile memory device having a tunnel oxide layer thicker than 20 Å is provided. A program operation of the method is accomplished by applying a program voltage higher than 0 volts and a ground voltage to a gate electrode and a channel region of a selected SONOS cell transistor, respectively. Also, an erasing operation is accomplished by applying a ground voltage and a first erase voltage lower than 0 volts to a bulk region and a gate electrode of a selected SONOS cell transistor, respectively, and by applying a second erasure voltage to either a drain region or a source region of the selected SONOS cell transistor. The second erase voltage is a ground voltage or a positive voltage. In addition, a read operation is accomplished using either a backward read mode or a forward read mode. Thus, it is possible to remarkably improve a bake retention characteristic, which is sensitive to a thickness of the tunnel oxide layer.

59 Claims, 7 Drawing Sheets

OPERATING A NON-VOLATILE MEMORY DEVICE

RELATED APPLICATION

This application relies for priority upon Korean Patent Application No. 2001-65030, filed on Oct. 22, 2001, the contents of which are herein incorporated by reference in their entirety.

TECHNICAL FIELD

This disclosure relates to operating a semiconductor device, and more particularly to a method of operating a non-volatile memory device having a silicon-oxide-nitride-oxide-silicon (SONOS) gate structure.

BACKGROUND OF THE INVENTION

Non-volatile semiconductor memory devices have a beneficial characteristic in that previous data are not erased although power is not supplied. Non-volatile memory devices are widely used in mobile telecommunication systems and computer memory cards.

Generally, non-volatile memory devices include a stacked gate structure. The stacked gate structure includes a tunnel oxide layer, a floating gate, an inter-gate dielectric layer and a control gate electrode, which are sequentially stacked on a channel region of the cell transistor. Thus, the non-volatile memory device with the stacked gate structure has a high step difference between a cell array region and a peripheral circuit region. This can lead to difficulty in subsequent processing of the memory device. Additionally, a process of patterning the floating gate is complicated and it is not easy to increase a surface area of the floating gate. The surface area of the floating gate influences a coupling ratio of the cell transistor, and the coupling ratio relates to a program characteristic and an erase characteristic of the cell transistor. In other words, it is required to increase the surface area of the floating gate in order to improve the program characteristic and the erase characteristic. However, with a highly integrated non-volatile memory device, there are limitations in increasing the surface area of the floating gate.

FIG. 1 illustrates a cross-sectional view explaining a conventional SONOS cell transistor.

Referring to FIG. 1, a source region 3s and a drain region 3d, which are spaced from each other, are arranged in a semiconductor substrate 1. A tunnel oxide layer 5, a charge trapping layer 7, a blocking oxide layer 9 and a gate electrode 11 are sequentially stacked on a channel region between the source region 3s and the drain region 3d. The tunnel oxide layer 5 is formed of a thermal oxide layer that is thinner than 20 Å, and the charge trapping layer 7 is formed of silicon nitride layer. Additionally, the blocking oxide layer 9 is formed of a CVD oxide layer with a thickness of about 60 Å, and the gate electrode 11 is formed of a conductive layer such as a doped polysilicon layer.

FIG. 2 illustrates a graph explaining an erasing operation of a conventional SONOS cell transistor. In FIG. 2, a horizontal axis indicates an electric field E applied to the tunnel oxide layer 5 or the blocking oxide layer 9 of FIG. 1, and a vertical axis indicates a tunneling current Itun flowing through the tunnel oxide layer 5 or the blocking oxide layer 9 according to the electric field E.

Referring to FIG. 2, the tunneling current Itun flowing through the blocking oxide layer 9 having a thickness of about 60 Å is subject to the Fowler-Nordheim (F-N) tunneling, and is proportional to the electric field E applied to the blocking oxide layer 9 (Refer to a curve (①). However, a tunneling current Itun flowing through the tunneling oxide layer 5 shows a remarkably low increment in comparison with the tunneling current Itun flowing through the blocking oxide layer 9 (Refer to curves ② and ③). The curve ② indicates a tunneling current flowing through a thin tunnel oxide layer having a thickness of about 20 Å, and the curve ③ indicates a tunneling current flowing through a tunnel oxide layer having a thickness of about 30 Å. Consequently, the tunneling current flowing through the tunnel oxide layer 5 having a thickness of 20 Å to 30 Å is subject to a direct tunneling, differently from the F-N tunneling current flowing through the blocking oxide layer 9. The dominant tunneling mechanism is determined by the thickness of the tunnel oxide layer or the blocking oxide layer.

As can be seen from the curves ② and ③, as the thickness of the tunnel oxide layer 5 is increased, the tunneling current is further decreased. Consequently, in the case that the tunnel oxide layer 5 is thicker than 20 Å, the erasing operation may be unsuccessfully performed. This is because the tunneling current flowing through the blocking oxide layer 9 is larger than other tunneling current flowing through the tunnel oxide layer 5 at an electric field region (a lower region than Ec) where at least a tunneling current may flow, as shown in FIG. 2. That is, since the number of electrons injected into the charge trapping layer 7 through the blocking oxide layer 9 is greater than that of holes injected thereinto through the tunnel oxide layer 5, it is difficult to effectively accomplish the erasing operation of removing electrons trapped in the electron trapping layer 7.

Thus, for a successful erasing operation, the tunnel oxide layer 5 should be thinner than 20 Å. However, in the case that the tunnel oxide layer 5 is thinner than 20 Å, it is difficult to improve a data retention characteristic, i.e., a bake retention characteristic performed at a temperature of 85° C.

SUMMARY OF THE INVENTION

Embodiments of the invention provide a method of operating a non-volatile memory device having SONOS cell transistors with tunnel oxide layers thicker than 20 Å, in order to improve a data retention characteristic as well as a problem in erasing operation.

Some embodiments operate a programmable and erasable SONOS cell transistor and corresponding memory device by using a F-N tunneling and a channel hot hole.

According to an aspect of the present invention, a method of operating a SONOS cell transistor is provided. The SONOS cell transistor includes a source region and a drain region that are spaced apart from each other in the semiconductor substrate. The SONOS cell transistor further includes a tunnel oxide layer, a charge trapping layer, a blocking oxide layer and a gate electrode that are sequentially stacked on a channel region between the source region and the drain region. An erase method of the SONOS cell transistor includes applying a ground voltage to the semiconductor substrate, applying a first erasure voltage to the gate electrode, and applying a second erasure voltage to at least one of the drain region and the source region. The first erasure voltage is a negative voltage lower than the ground voltage. The second erasure voltage is preferably the ground voltage or a positive voltage higher than the ground voltage. Thus, in the case that the second erasure voltage is the ground voltage, holes are injected into a part of the charge trapping layer overlapped with the source region and/or the drain region where the second erasure voltage is applied, due to a band to band tunneling resulting from a voltage difference between the first erasure voltage and the second erasure voltage. Differently from this, in the case that the second erasure voltage is a positive voltage, not only the band to band tunneling current but also channel hot holes are generated at the channel region around the source region and/or the drain region where the second erasure voltage is applied. Thus, the channel hot holes and the holes resulting from the band to band tunneling are injected into the charge trapping layer through the tunnel oxide layer.

Meanwhile, programming of the SONOS cell transistor is accomplished by using a conventional method. That is, the programming of the SONOS cell transistor includes applying a ground voltage to the semiconductor substrate and applying a high voltage of 10 volts to 20 volts to the gate electrode. As a result, electrons are injected into the charge trapping layer, thereby increasing a threshold voltage of the SONOS cell transistor. In this case, the programming operation is accomplished by tunneling current that is due to a Fowler-Nordheim (F-N) tunneling, and the injected electrons are uniformly distributed throughout the entire charge trapping layer. Thus, in the event that the second erasure voltage is applied to the drain region and the source region is floated in order to erase the programmed cell transistor, holes are mostly injected into only a part of the charge trapping layer adjacent to the drain region. Thus, the erased SONOS cell transistor has an asymmetrical shape. On the contrary, in the event that the second erase voltage is applied to the source region and the drain region is floated in order to erase the programmed cell transistor, holes are mostly injected into only a part of the charge trapping layer adjacent to the source region. Thus, in this case, the erased SONOS cell transistor also has an asymmetrical shape.

However, in the case that the second erasure voltage is applied to the drain region and the source region in order to erase the SONOS cell transistor, holes are injected into both edges of the charge trapping layer adjacent to the drain region and the source region. Thus, the erased SONOS cell transistor has a symmetrical shape.

A read method of the erased cell transistor, in which holes are injected into only a part of the charge trapping layer adjacent to the drain region, includes grounding the drain region and the semiconductor substrate, applying a first read voltage to the gate electrode, and applying a second read voltage to the source region. The first read voltage should be lower than a threshold voltage of the programmed cell transistor and higher than a threshold voltage of the erased cell transistor. For example, the first read voltage corresponds to 0 volts to 2 volts. Also, the second read voltage should be higher than a voltage applied to the drain region. That is, the second read voltage is preferably higher than 0 volts and lower than 1 volt. Consequently, in the case that the second erasure voltage is applied to only the drain region to erase the SONOS cell transistor, a backward read mode is applied. The backward read mode means that a voltage applied to the source region is higher than a voltage applied to the drain region.

Differently from this, a read method of the erased cell transistor in which holes are injected into only a part of the charge trapping layer adjacent to the source region includes grounding the source region and the semiconductor substrate, applying a first read voltage to the gate electrode, and applying a second read voltage higher than the ground voltage to the drain region. This read mode corresponds to a forward read mode.

Additionally, in the case that holes are injected into both edges of the charge trapping layer adjacent to the source region and the drain region, either forward read mode or the backward read mode can be applied.

According to another aspect of the present invention, a method of operating a NAND-type non-volatile memory device composed of a plurality of SONOS cell transistors is provided. The NAND-type non-volatile memory device includes a cell array region having a plurality of NAND-type strings, which are arranged two-dimensionally on the semiconductor substrate. Each of the NAND-type strings has a string selection transistor, a plurality of SONOS cell transistors and a ground selection transistor that are connected in series. A drain region of the string selection transistor is connected to a bit line and a source region of the ground selection transistor is connected to a common source line. Also, a gate electrode of the string selection transistor and a gate electrode of the ground selection transistor are connected to a string selection line and a ground selection line, respectively. Gate electrodes of the plurality of SONOS cell transistors are connected to a plurality of word lines, respectively.

An erase method of the NAND-type SONOS non-volatile memory device includes applying a ground voltage to the semiconductor substrate, applying a first erasure voltage to one selected out of the plurality of word lines and applying a second erasure voltage to at least one selected out of the plurality of bit lines. Thus, at least one SONOS cell transistor connected to the selected bit line and the selected word line is selected. The first erasure voltage is a negative voltage, lower than the ground voltage, and the second erasure voltage is the ground voltage or a positive voltage higher than the ground voltage. The string selection transistors and SONOS cell transistors connected to unselected word lines out of the plurality of word lines are turned on to apply the second erasure voltage to a drain region of the selected SONOS cell transistor. Thus, in the case that the second erasure voltage is the ground voltage, a band to band tunneling current flows through a tunnel oxide layer overlapped with the drain region. As a result, holes are injected into the charge trapping layer on the drain region by the band to band tunneling current. Differently from this, in the case that the second erasure voltage is a positive voltage, not only the band to band tunneling current but also hot holes are generated in the depletion region of the drain region of the selected SONOS cell transistor. These hot holes are locally injected into a part of the charge trapping layer adjacent to the drain through a tunnel oxide layer of the selected SONOS cell transistor together with holes resulting from the band to band tunneling. Consequently, the erased SONOS cell transistor has an asymmetrical shape.

Additionally, the ground selection transistors can be turned on or turned off during the erasing operation. In the case that the ground selection transistors are turned off, a source region of the selected SONOS cell transistor floats. Unlike this, in the event that the ground selection transistors are turned on, the common source line floats. Thus, a source side injection of the hot holes is restrained.

Information of the erased SONOS cell transistor where the hot holes are locally injected into the charge trapping layer adjacent to the drain region as describe above is read out by the following method. The read method includes applying a ground voltage to at least one selected out of the bit lines, applying a first read voltage to one selected out of the word lines, and applying a second read voltage higher than the ground voltage to the common source line. At this time, the semiconductor substrate is grounded, and SONOS cell transistors connected to unselected word lines out of the word lines, the string selection transistors and the ground selection transistors are all turned on. Thus, at least one SONOS cell transistor connected to the selected bit line and the selected word line is selected, and the ground voltage and the second read voltage are applied to the drain region and the source region of the selected SONOS cell transistor, respectively. Consequently, information stored in the selected SONOS cell transistor is read out by the backward read mode.

Another erase method of the NAND-type SONOS non-volatile memory device includes grounding the semiconductor substrate, applying a first erasure voltage, lower than the ground voltage, to one selected out of the plurality of word lines, and applying a second erasure voltage to the common source line. The second erasure voltage is preferably a ground voltage or a positive voltage higher than the ground voltage. Therefore, SONOS cell transistors connected to the selected word line and the common source line are selected. The ground selection transistors and SONOS cell transistors connected to unselected word lines out of the plurality of word lines are turned on to apply the second erasure voltage to source regions of the selected SONOS cell transistors. Thus, holes are locally injected into parts of the charge trapping layers adjacent to the source regions through the tunnel oxide layers of the selected SONOS cell transistors. Consequently, the erased SONOS cell transistors also have an asymmetrical shape.

Additionally, the string selection transistors can be turned on or turned off during the erasing operation. In the case that the string selection transistors are turned off, drain regions of the selected SONOS cell transistors are electrically floating. Differently from this, in the case that the string selection transistors are turned on, the bit lines float to electrically float drain regions of the selected SONOS cell transistors. Thus, the drain side injection is prevented.

Information of the erased SONOS cell transistor where holes are locally injected into the charge trapping layer adjacent to the source region as described above can be read by the following method. The read method includes applying a ground voltage to the common source line, applying a first read voltage to a selected one out of the word lines, and applying a second read voltage higher than the ground voltage to at least a selected one out of the bit lines. At this time, the semiconductor substrate is grounded, and the ground selection transistors, the string selection transistors, and SONOS cell transistors connected to unselected word lines out of the word lines are all turned on. Thus, at least one SONOS cell transistor connected to the selected bit line and the selected word line is selected, and the second read voltage and the ground voltage are applied on a drain region and a source region of the selected SONOS cell transistor, respectively. Consequently, information stored in the selected SONOS cell transistor is read by employing the forward read mode.

Still another erase method of the NAND-type SONOS non-volatile memory device includes grounding the semi-conductor substrate, applying a first erasure voltage that is lower than a ground voltage to a selected one out of the plurality of word lines, and applying a second erasure voltage to the common source line and at least a selected one of the bit lines. The second erasure voltage is a ground voltage or a positive voltage. Thus, at least one SONOS cell transistor connected to the common source line and the selected bit line is selected. The string selection transistors, the ground selection transistors and SONOS cell transistors connected to unselected word lines out of the plurality of word lines are turned on to apply the second erasure voltage to a source region and a drain region of the selected SONOS cell transistor. Thus, holes are locally injected into both edges of the charge trapping layer through a tunnel oxide layer of the selected SONOS cell transistor. Consequently, the erased SONOS cell transistor has a symmetrical shape.

Information of the erased SONOS cell transistor where hot holes are locally injected into both edges of the charge trapping layer as described above can be read by either the backward read mode or the forward read mode.

According to still another aspect of the present invention, embodiments of the present invention provide a method of operating a NAND-type SONOS non-volatile memory device which is capable of simultaneously erasing all SONOS cell transistors in a block composed of a plurality of NAND-type strings as well as programming by a cell unit or a page unit. A cell array region of the NAND-type SONOS non-volatile memory device has the same structure as the cell array region of the formerly explained NAND-type SONOS non-volatile memory device. The block erase method includes applying an erasure voltage of 10 volts to 20 volts to all of the word lines connected to the plurality of NAND strings arranged in a selected block and applying a ground voltage to the semiconductor substrate. Thus, electrons are uniformly injected into the charge trapping layers of all SONOS cell transistors in the selected block due to F-N tunneling current. In this case, a cell transistor where a threshold voltage is increased is regarded as an erased cell transistor.

A method of programming the erased SONOS cell transistors in the block is very similar to the erase method using the drain side injection or using the source and drain sides injection that is formerly explained.

In addition, a method of reading a cell transistor programmed by the drain side injection is very similar to the backward read mode. Other methods of reading a cell transistor programmed by the source and drain sides injection can be performed using either the backward read mode or the forward read mode.

DESCRIPTION OF THE PREFERRED EMBODIMENT

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
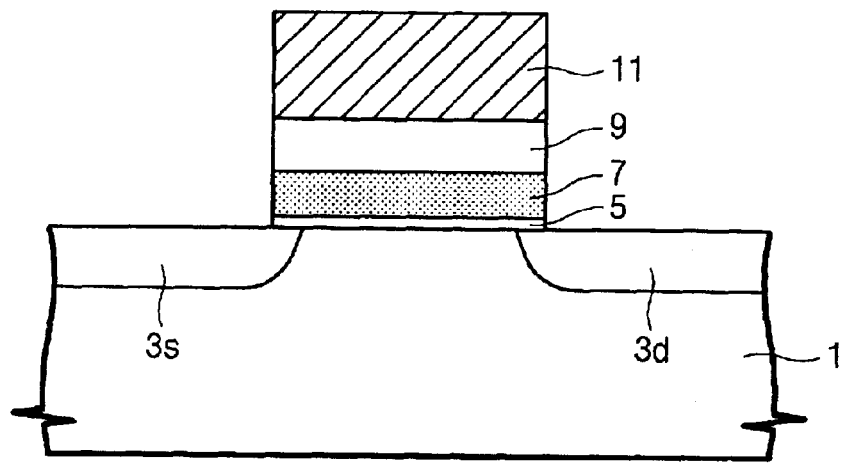
FIG. 1 is a cross-sectional view showing a conventional SONOS cell having a tunnel oxide layer with a thickness of 20 Å or less.
Figure 2:
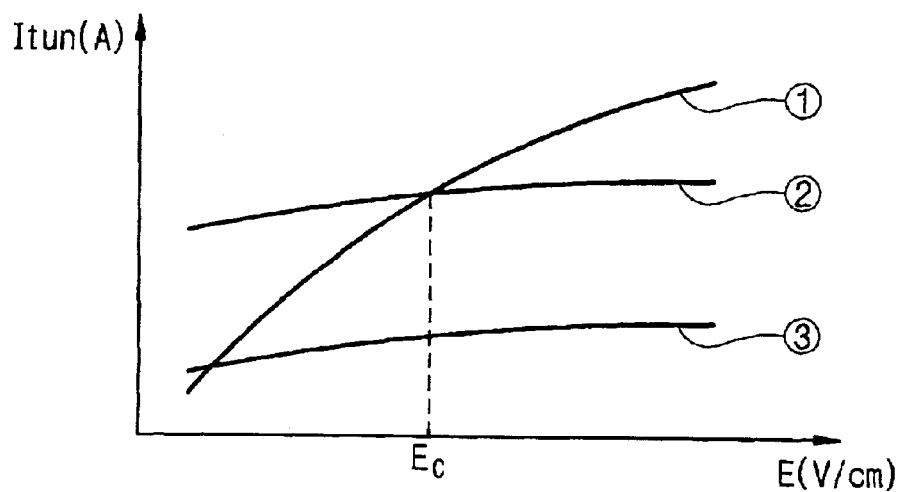
FIG. 2 is a graph for explaining an operation of a non-volatile memory cell having a SONOS gate structure.
Figure 3A:
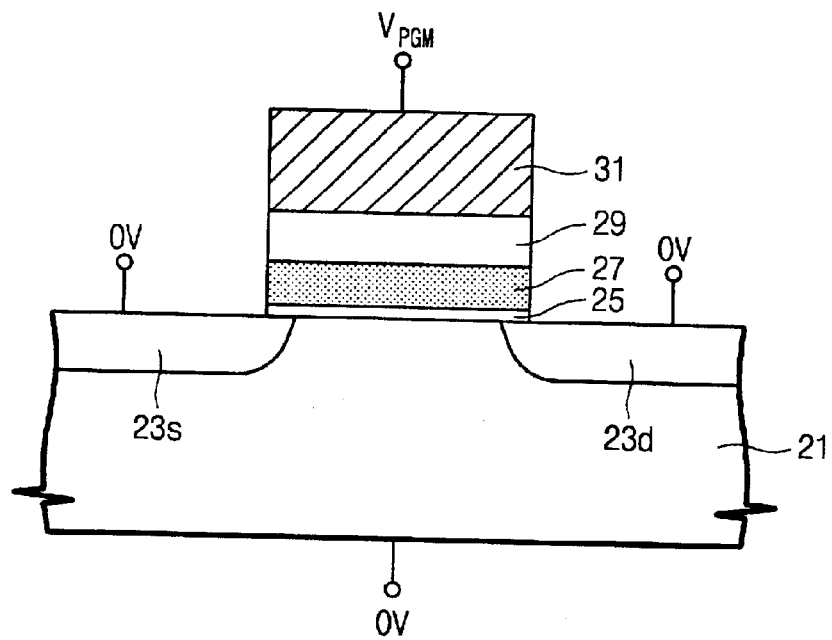
FIG. 3A is a cross-sectional view for explaining a programming method of a unit SONOS cell according to an embodiment of the present invention.

FIG. 3A is a cross-sectional view for explaining a programming method of a unit SONOS cell transistor according to embodiments of the present invention.

Referring to FIG. 3A, a unit SONOS cell transistor includes an N+ type source region 23s and an N+ type drain region 23d that are formed at a P-type semiconductor substrate 21 and are spaced from each other. The unit SONOS cell transistor further comprises a tunnel oxide layer 25, a charge trapping layer 27, a blocking oxide layer 29 and a gate electrode 31 that are sequentially stacked on a channel region between the source region 23s and the drain region 23d. The tunnel oxide layer 25 is thicker than 20 Å. In addition, the thickness of the tunnel oxide layer 25 is equal to or less than that of the blocking oxide layer 29. Also, the blocking oxide layer 29 has a thickness of 40 Å to 80 Å. Preferably, the charge trapping layer is a silicon nitride layer.

The SONOS cell transistor is programmed by applying a program voltage VPGM to the gate electrode 31 and by applying a ground voltage to the semiconductor substrate 21, the source region 23s and the drain region 23d. The program voltage is preferably a positive voltage of 10 volts to 20 volts. Thus, electrons are uniformly injected into the charge trapping layer 27 due to F-N tunneling current flowing through the tunnel oxide layer 25, thereby increasing a threshold voltage of the SONOS cell transistor.

Figure 3B:
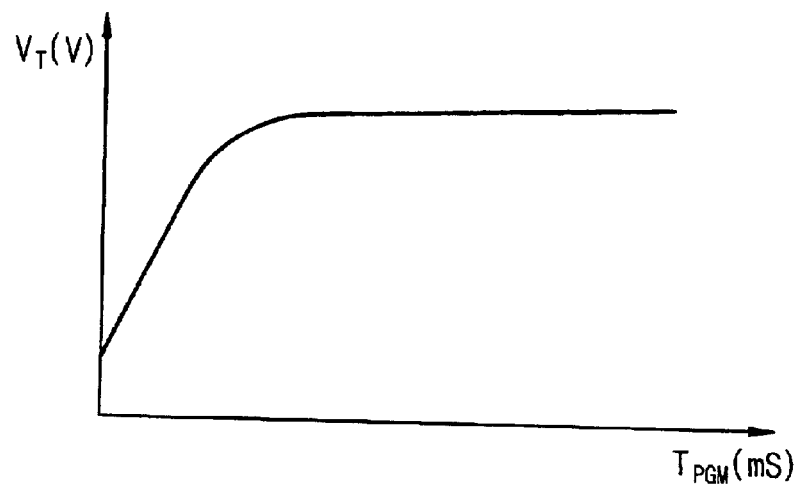
FIG. 3B is a graph showing a relationship between a threshold voltage of a unit SONOS cell and program time.

FIG. 3B is a graph showing a relationship between a threshold voltage of the SONOS cell transistor and program time TPGM. In FIG. 3B, a horizontal axis indicates the program time TPGM and a vertical axis indicates the threshold voltage VT of a programmed SONOS cell transistor.

As can be seen from the FIG. 3B, the threshold voltage VT of the programmed SONOS cell transistor is not linearly proportional to the program time. That is, although the program time is continuously increased, the threshold voltage of the SONOS cell transistor is saturated towards a certain value. This is because no more electrons are trapped in the charge trapping layer even though a program voltage is continuously applied to the gate electrode, because trap sites in the charge trapping layer are already filled with electrons.

Figure 3C:
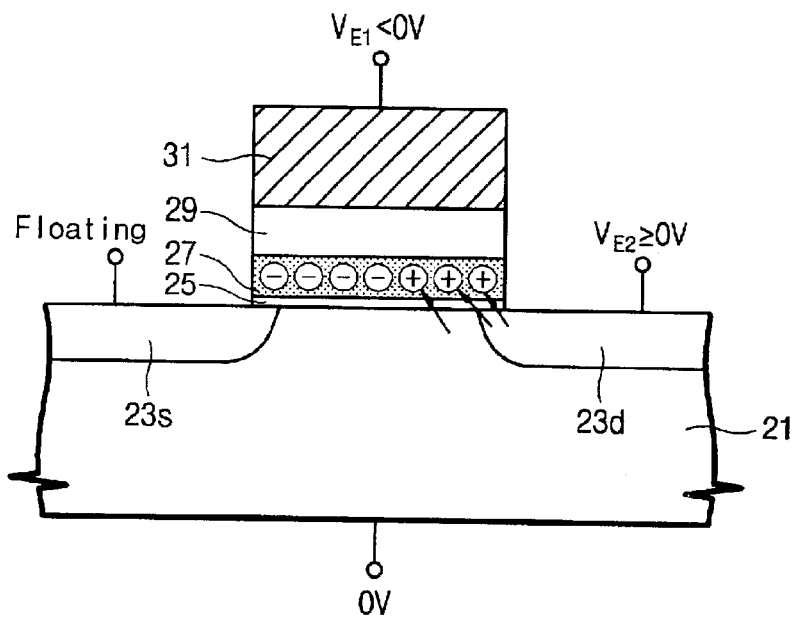
FIG. 3C is a cross-sectional view illustrating an erase method of a unit SONOS cell according to an embodiment of the present invention.

FIG. 3C is a cross-sectional view for explaining a method of erasing the programmed SONOS cell transistor according to one embodiment of the present invention.

Referring to FIG. 3C, the programmed SONOS cell transistor is erased by applying a first erasure voltage VE1 to the gate electrode 31, by applying a second erasure voltage VE2 to the drain region 23d and by grounding the semiconductor substrate 21. At this time, the source region 23s is preferably floating. The first erasure voltage VE1 is a negative voltage lower than the ground voltage, and the second erasure voltage VE2 is the ground voltage or a positive voltage higher than the ground voltage. For example, it is preferable that the first erasure voltage VE1 is −4 volts to −10 volts and the second erasure voltage VE2 is higher than the ground voltage and less than 8 volts. Thus, a reverse bias is applied to the drain junction, thereby generating hot holes in a depletion region around the drain region 23d. These hot holes are injected into the charge trapping layer 27 through the tunnel oxide layer 25 due to the electric field by the first erasure voltage VE1. Additionally, a deep depletion layer is formed in the drain region 23d by a voltage difference between the first erasure voltage VE1 and the second erasure voltage VE2. Thus, a band to band tunneling current flows through the tunnel oxide layer 25 overlapped with the drain region. Consequently, the holes are locally injected into the charge trapping layer 27 in an area over the drain region 23d.

In the event that the second erasure voltage VE2 is the ground voltage, only the band to band tunneling current flows. Thus, in that case, only holes by the band to band tunneling current are injected into the charge trapping layer 27 on the drain region 23d.

Consequently, a drain side injection phenomenon that holes are injected into the charge trapping layer 27 around the drain region 23d occurs. At this time, a source side injection is restrained since the source region 23s is floating. Thus, as illustrated in FIG. 3C, the erased SONOS cell transistor has an asymmetrical shape in its charge trapping layer 27.

Figure 3D:
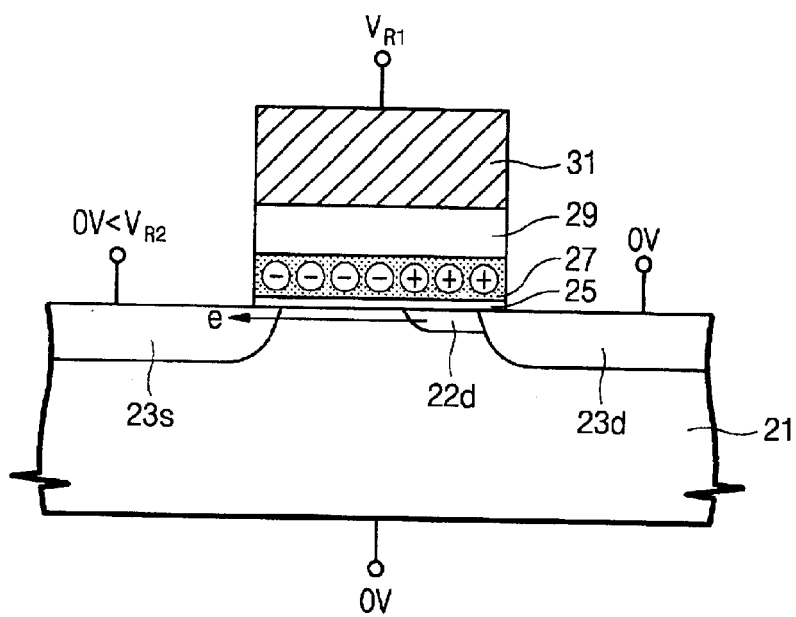
FIG. 3D is a cross-sectional view illustrating a reading method of a unit SONOS cell according to one embodiment of the present invention.

FIG. 3D is a cross-sectional view for explaining a reading method of the erased SONOS cell transistor according to one embodiment of the present invention.

Referring to FIG. 3D, in the SONOS cell transistor erased by the drain side injection, as illustrated, an N-type channel inversion layer 22d is formed at the channel region adjacent to the drain region 23d. The channel inversion layer 22d is formed by the holes trapped in the charge trapping layer 27 around the drain region. Thus, in order to turn on the erased SONOS cell transistor having the asymmetrical shape as shown in FIG. 3D, a voltage applied to the source region 23s should be higher than a voltage applied to the drain region 23d, such as is taught by, for instance, U.S. Pat. No. 5,768,192.

In detail, the erased SONOS cell transistor is read by applying a first read voltage VR1 to the gate electrode 31, by applying a second read voltage VR2 to the source region 23s, and by grounding the drain region 23d and the semiconductor substrate 21. The first read voltage VR1 should be lower than the threshold voltage of a programmed SONOS cell transistor and higher than the threshold voltage of an erased SONOS cell transistor, and the second read voltage VR2 should be higher than the ground voltage. For example, the first read voltage VR1 is preferably 0 to 2 volts, and the second read voltage VR2 is preferably higher than 0 volts and lower than 2 volts. This read mode is called a backward read mode and the backward read mode is disclosed in the U.S. Pat. No. 5,768,192 in detail. Consequently, the erased SONOS cell transistor is turned on by a punchthrough between the channel inversion layer 22d and the source region 23s. Meanwhile, the programmed SONOS cell transistor is turned off even in the backward read mode.

Figure 4A:
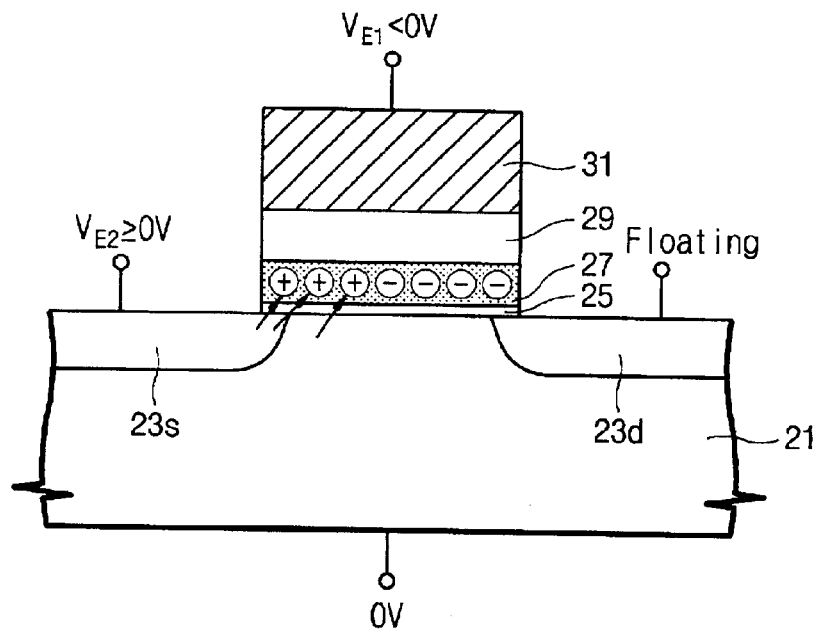
FIG. 4A is a cross-sectional view illustrating an erase method of a unit SONOS cell according to another embodiment of the present invention.

FIG. 4A is a cross-sectional view for explaining a method of erasing the programmed SONOS cell transistor, according to another embodiment of the present invention.

Referring to FIG. 4A, the first erasure voltage VE1 is applied to the gate electrode 31 of the SONOS cell transistor which has been programmed by the method explained in FIG. 3A. Also, the semiconductor substrate 21 is grounded, and the second erasure voltage VE2 is applied to the source region 23s. At this time, the drain region 23d is floating. Thus, differently from the first embodiment, holes are injected into the charge trapping layer 27 around the source region 23s by a source side injection.

Figure 4B:
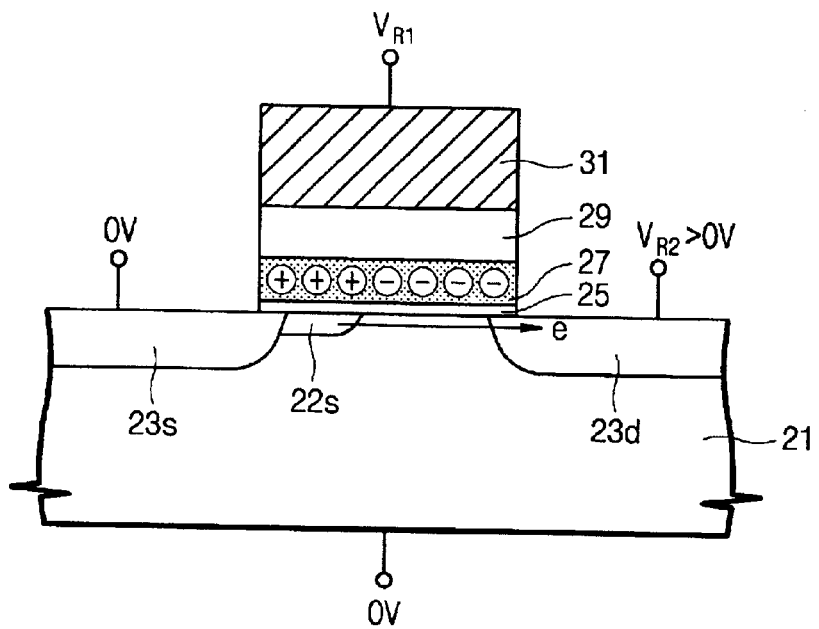
FIG. 4B is a cross-sectional view illustrating a reading method of a unit SONOS cell according to another embodiment of the present invention.

FIG. 4B is a cross-sectional view for explaining a method of reading the erased SONOS cell transistor illustrated in FIG. 4A, according to another preferred embodiment of the present invention.

Referring to FIG. 4B, in the SONOS cell transistor that has been erased by the source side injection, an N-type channel inversion layer 22s is formed in the channel region around the source region 23s. The channel inversion layer 22s is formed by holes trapped in the charge trapping layer 27 around the source region 23s. Thus, in order to turn on the erased SONOS cell transistor having this asymmetrical shape, the voltage applied to the drain region 23d should be higher than the voltage applied to the source region 23s. That is, the SONOS cell transistor erased by the source side injection is read by applying the first read voltage VR1 to the gate electrode 31, by applying the second read voltage VR2 to the drain region 23d, and by applying a ground voltage to the source region 23s and the semiconductor substrate 21.

The read mode can be easily deduced from the first embodiment described above. This read mode is called a forward read mode, and the forward read mode is disclosed in the U.S. Pat. No. 5,768,192 in detail. Consequently, the erased SONOS cell transistor is turned on by a punch-through between the channel inversion layer 22s and the drain region 23d. However, the programmed SONOS cell transistor is turned off even in the forward read mode.

Figure 5:
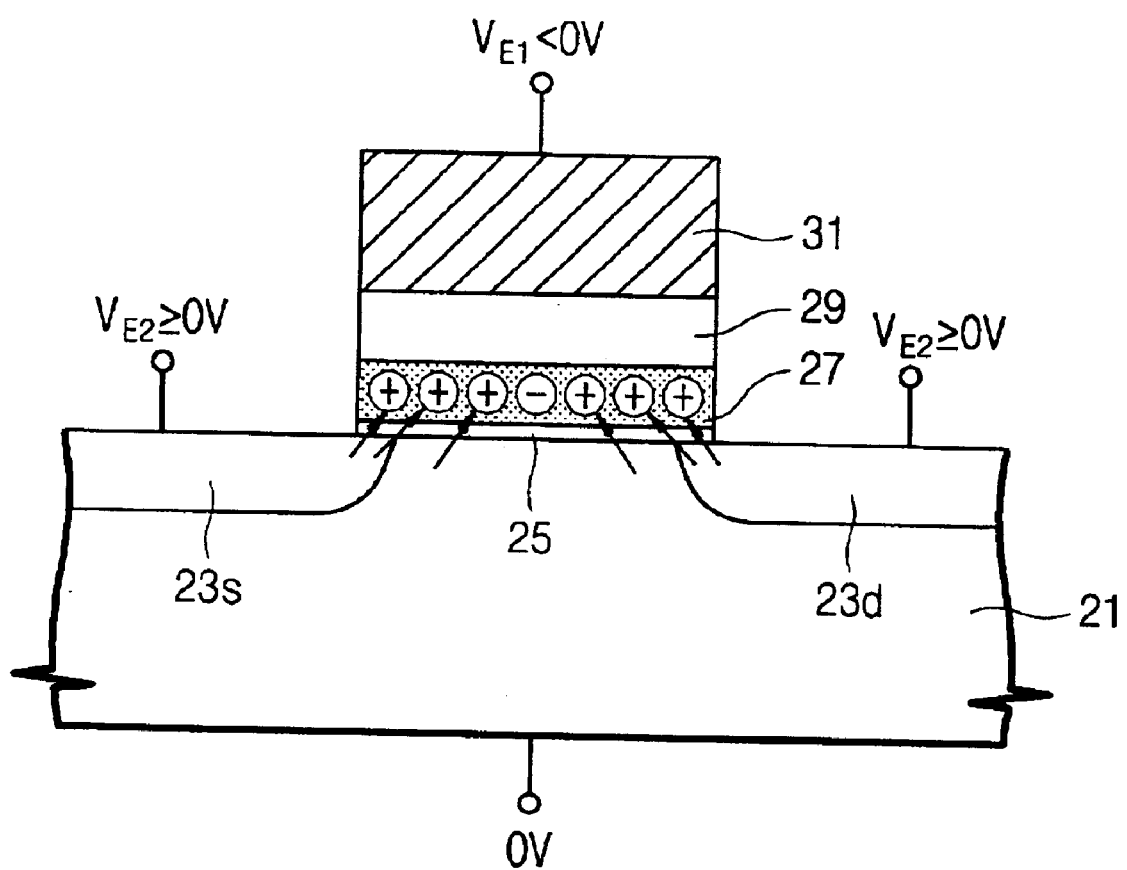
FIG. 5 is a cross-sectional view illustrating an erase method of a unit SONOS cell according to still another embodiment of the present invention.

FIG. 5 is a cross-sectional view for explaining a method of erasing the programmed SONOS cell transistor according to still another embodiment of the present invention.

Referring to FIG. 5, the first erasure voltage VE1 is applied to the gate electrode 31 and a ground voltage is applied to the semiconductor substrate 21. Also, the second voltage VE2 is applied to the source region 23s and the drain region 23d. Thus, holes are injected into both edges of the charge trapping layer 27 adjacent to the source region 23s and the drain region 23d. Consequently, the SONOS cell transistor erased according to the present invention can be read by using either the backward read mode or the forward read mode.

Next, a method of operating a SONOS non-volatile memory device will be explained with reference to FIG. 6.

Figure 6:
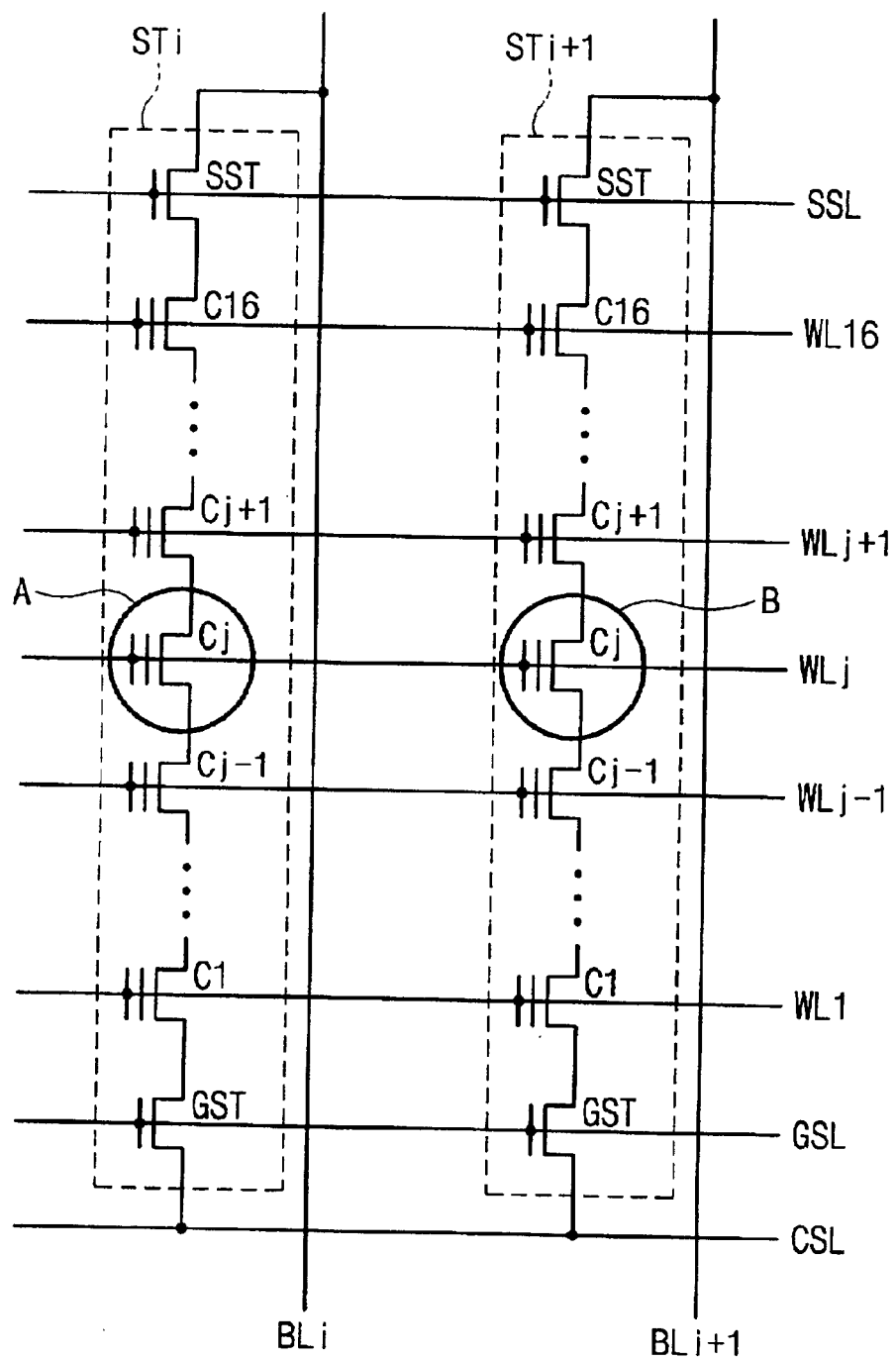
FIG. 6 is a circuit diagram showing a part of a cell array region for explaining a method of operating a NAND-type SONOS non-volatile memory device according to embodiments of the present invention.

FIG. 6 is an equivalent circuit diagram showing a part of a cell array region for explaining methods of operating a NAND-type SONOS non-volatile memory device. The present invention is explained in conjunction with a non-volatile memory device having a NAND-type string composed of 16 SONOS cell transistors but not limited to the embodiments set forth herein. For example, the present invention may be applicable to a non-volatile memory device having a NAND-type string composed of 8, 32 or 64 SONOS cell transistors.

Referring to FIG. 6, a plurality of NAND-type strings STi and STi+1 are arranged along row directions and column directions at a semiconductor substrate (not shown). Each of the NAND-type strings includes a string selection transistor SST, sixteen SONOS cell transistors $C_1, \ldots, C_{j-1}, C_j, C_{j+1}, \ldots, C_{16}$, and a ground selection transistor GST which are connected in series. A drain region of each of the string selection transistors SST is connected to one bit line BLi or $BL_{i+1}$ and source regions of the ground selection transistors GST are connected to one common source line CSL. Also, gate electrodes of the string selection transistors SST are connected to a string selection line SSL, and gate electrodes of the ground selection transistors GST are connected to a ground selection line GSL. Additionally, the gate electrodes of the first SONOS cell transistors $C_1$ are connected to a first word line WL1, and the gate electrodes of the 16$^{th}$ SONOS cell transistors C16 are connected to a 16th word line WL16. Consequently, 16 parallel word lines $WL_1, \ldots, WL_{16}$ are arranged between the string selection line SSL and the ground selection line GSL. The plurality of NAND-type strings constitute one block.

Now, methods of operating a NAND-type SONOS non-volatile memory device are explained with reference to FIG. 6 and the following table 1.

First, a method of selectively programming a unit cell A of FIG. 6 is explained.

TABLE 1

| | | Program | Erase 1 | Read 1 | Erase 2 | Read 2 | Erase 3 |
|---|---|---|---|---|---|---|---|
| | SSL | Vcc | $V_{PASS}$ | 3–6 V | $V_{PASS}$ (0 V) | 3–6 V | $V_{PASS}$ |
| BL | Selected | 0 V | $V_{E2}$ | 0 V | Float (0 V) | $V_{R2}$ | $V_{E2}$ |
| | Non-selected | $V_{pi}$ | Float | | | | Float |
| WL | Selected | $V_{PGM}$ | $V_{E1}$ | $V_{R1}$ | $V_{E1}$ | $V_{R1}$ | $V_{E1}$ |
| | Non-selected | $V_{PASS}$ | $V_{PASS}$ | 3–6 V | $V_{PASS}$ | 3–6 V | $V_{PASS}$ |
| | GSL | 0 V | $V_{PASS}$ (0 V) | 3–6 V | $V_{PASS}$ | 3–6 V | $V_{PASS}$ |
| | CSL | 0 V | Float (0 V) | $V_{R2}$ | $V_{E2}$ | 0 V | $V_{E2}$ |
| | SUB | 0 V | 0 V | 0 V | 0 V | 0 V | 0 V |

Referring to FIG. 6 and the table 1, a ground voltage is applied to the semiconductor substrate. Zero volts and a power supply voltage Vcc are applied to the bit line $BL_i$ connected to the i-th string $ST_i$ and the string selection line SSL, respectively, to select the i-th string $ST_i$. Then, a program voltage $V_{PGM}$ is applied to the j-th word line $WL_j$ out of the plurality of word lines $WL_1, \ldots, WL_{16}$ connected to the i-th string $ST_i$ to select a unit SONOS cell transistor A. The program voltage $V_{PGM}$ should be a high voltage enough to generate a F-N tunneling current flowing through a tunnel oxide layer of the selected SONOS cell transistor A. For example, the program voltage $V_{PGM}$ is preferably 10 volts to 20 volts. At this time, a pass voltage VPASS is applied to the unselected word lines $WL_1, \ldots, WL_{j-1}, WL_{j+1}, \ldots, WL_{16}$ to turn on all of the unselected SONOS cell transistors. The pass voltage VPASS should be lower than the program voltage $V_{PGM}$ and be capable of turning on the programmed cell transistor. For example, the pass voltage $V_{PASS}$ is preferably 5 volts to 8 volts.

Also, a ground voltage is applied to the ground selection voltage GSL to turn off all of the ground selection transistors GST. At this time, the common source line CSL may be grounded or left floating. In the meantime, a program inhibition voltage Vpi is applied to the unselected bit lines, i.e., i+1-th bit line $BL_{i+1}$. The program inhibition voltage Vpi is preferably a power supply voltage Vcc higher than 0 volts.

Figure 7A:
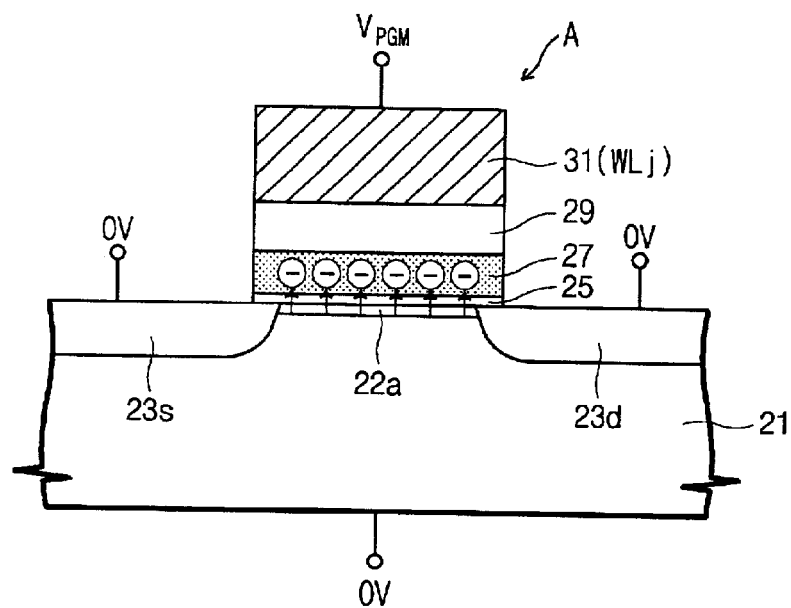
FIG. 7A is a cross-sectional view illustrating a mechanism where a cell A of FIG. 6 is selectively programmed.

Consequently, as shown in FIG. 7A, the ground voltage applied to the selected bit line BLi is applied to a drain region 23d of the selected SONOS cell transistor A. Additionally, an N-type inversion layer 22a is formed in the channel region of the selected SONOS cell transistor A. Thus, the ground voltage is applied to the inversion layer 22a and a source region 23s of the selected SONOS cell transistor A. Thus, electrons are uniformly passed into the charge trapping layer 27 of the selected SONOS cell transistor A to increase a threshold voltage of the selected SONOS cell transistor A.

Figure 7B:
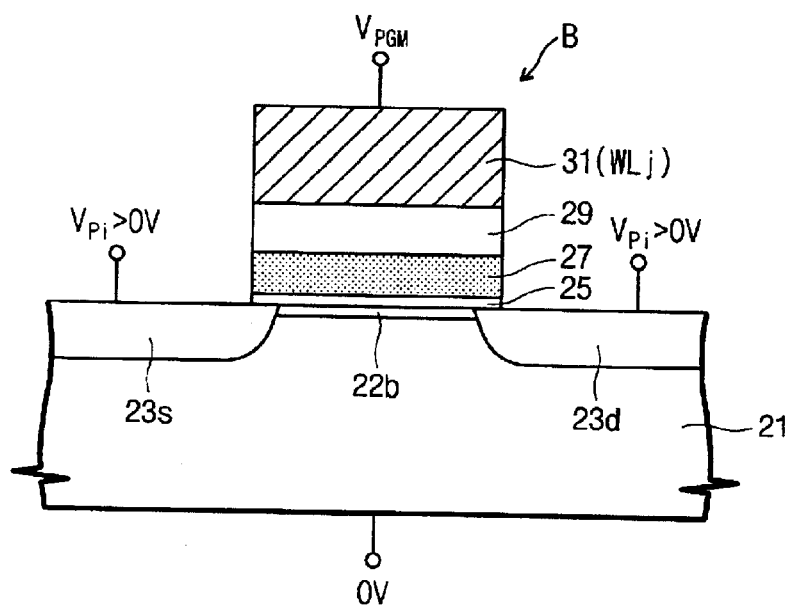
FIG. 7B is a cross-sectional view for explaining a mechanism where a non-selected cell B of FIG. 6 is not programmed.

However, as shown in FIG. 7B, if the program inhibition voltage Vpi is applied to a drain region 23d of an unselected SONOS cell transistor B in the i+1-th string $ST_{i+1}$, an N-type inversion layer 22b is formed in a channel region of the unselected SONOS cell transistor B. Thus, the program inhibition voltage $V_{pi}$ is applied to the inversion layer 22b and the source region 23s of the unselected SONOS cell transistor B. Thus, it can prevent the unselected SONOS cell transistor B from being programmed.

In the event that the ground voltage is applied to the plurality of bit lines $BL_i$, $BL_{i+1}$, all of the SONOS cell transistors A and B connected to the plurality of bit lines $BL_j$, $BL_{j+1}$ and the selected word line $WL_j$ are programmed. That is, a page program operation is performed.

The programmed SONOS cell transistor can be erased using any one of the three embodiments.

An erase method (Erase 1 of Table 1) according to the first embodiment of the present invention employs the drain-side injection method explained in FIG. 3C. In detail, the ground voltage is applied to the semiconductor substrate and a first erasure voltage VE1 is selectively applied to any one (for example, $WL_j$) out of the plurality of word lines. The first erasure voltage VE1 corresponds to a negative voltage lower than Zero volts. For example, the first erasure voltage VE1 is preferably –4 volts to –10 volts. A pass voltage VPASS of 5 volts to 8 volts is applied to the unselected word lines $WL_1, \ldots, WL_{j-1}, WL_{j+1}, \ldots, WL_{16}$ out of the plurality of word lines to turn on all of the unselected SONOS cell transistors $C_1, \ldots, C_{j-1}, C_{j+1}, \ldots, C_{16}$.

A second erasure voltage $V_{E2}$ is then applied to at least one out of the bit lines, for example, to an i-th bit line $BL_i$ to select the i-th bit line $BL_i$, and the unselected bit lines are floated. The second erasure voltage $V_{E2}$ is preferably a positive voltage higher than zero volts. For example, the second erasure voltage $V_{E2}$ is preferably higher than zero volts and lower than 8 volts. Unlike this, the second erasure voltage $V_{E2}$ can be a ground voltage. Also, the pass voltage VPASS is applied to the string selection line SSL and the ground selection line GSL to turn on the string selection transistors SST and ground selection transistors GST. In this case, the common source line CSL is floated. Thus, the SONOS cell transistor A connected to the selected word line $WL_j$ and the selected bit line $BL_i$ is selected. As a result, the second erasure voltage $V_{E2}$ is applied to a drain region of the selected SONOS cell transistor A, and a source region of the selected SONOS cell transistor A is floated. Differently from this, a ground voltage may be applied to the ground selection line GSL to turn off the ground selection transistors GST. In this case, the source region of the selected SONOS cell transistor A is floated regardless of the voltage that is applied to the common source line CSL. Thus, the selected SONOS cell transistor A is erased by the drain side injection as explained in FIG. 3C. In the event that the second erasure voltage is applied to all of the bit lines, all of the SONOS cell transistors connected to the selected word lines $WL_j$ are erased. That is, a page erasing operation is performed.

Subsequently, a SONOS cell transistor erased by the drain side injection can be read by employing a backward read mode (Read 1 of Table 1) explained in FIG. 3D. In detail, in order to apply the backward read mode, a ground voltage is applied to the semiconductor substrate and all of the bit lines $BL_i$ and $BL_{i+1}$. Also, the first read voltage VR1 is applied to one selected out of the word lines, for example, the j-th word line $WL_j$. The first read voltage VR1 should be lower than a threshold voltage of the programmed SONOS cell transistor and higher than a threshold voltage of the erased SONOS cell transistor. For example, the first read voltage VR1 is preferably 0 volts to 2 volts.

Additionally, the second read voltage VR2 is applied to the common source line CSL and a voltage of 3 volts to 6 volts is applied to the string selection line SSL, the ground selection line GSL and the unselected word lines $WL_1, \ldots, WL_{j-1}, WL_{j+1}, \ldots, WL_{16}$. Thus, the string selection transistors SST, the ground selection transistors GST and the unselected SONOS cell transistors $C_1, \ldots, C_{j-1}, C_{j+1}, \ldots, C_{16}$ are all turned on. As a result, information of the SONOS cell transistors $C_j$ connected to the selected word line $WL_j$ is read. Differently from this, if zero volts is selectively applied to at least one bit line out of the bit lines and the unselected bit lines are floating, only the SONOS cell transistor connected to the selected bit line is selectively read.

Next, another erase method (Erase 2 of Table 1) according to the second embodiment of the present invention employs the source side injection method explained in FIG. 4A. According to this embodiment, the second erasure voltage $V_{E2}$ is applied to the common source line CSL, and the bit lines are all floating. Additionally, the pass voltage is applied to the ground selection line GSL and the string selection line SSL to turn on all of the ground selection transistors SST and the string selection transistors GST. Voltages applied to the other control lines are the same as in the erase method of the first embodiment. Alternatively, unlike the first embodiment, the string selection line SSL can be grounded. In this case, even though a ground voltage is applied to the bit lines, drain regions of all of the SONOS cell transistors $C_j$ connected to the selected word line $WL_j$ float. Thus, all of the SONOS cell transistors Cj connected to the selected word line $W_j$ are erased by a source side injection method.

A SONOS cell transistor erased by the source side injection can be read using the forward read mode (Read 2 of Table 1) explained in FIG. 4B. That is, a second voltage VR2 is applied to the bit lines, and a ground voltage is applied to the common source line CSL. Voltages applied to the other control lines are the same as in the reading method of the first embodiment.

Still another erase method (Erase 3 of Table 1) according to the third embodiment of the present invention can be accomplished using the source and drain sides injection method explained in FIG. 5. According to this embodiment, the pass voltage VPASS is applied to the ground selection line GSL and the second erasure voltage $V_{E2}$ is applied to the common source line CSL. Voltages applied to the other control lines are the same as in the erase method of the first embodiment. Thus, a SONOS cell transistor $C_j$ connected to the selected word line $WL_j$ and the selected bit line $BL_i$ is erased by the source and drain sides injection. At this time, SONOS cell transistors B connected to the unselected bit lines and the selected word line $WL_j$ are erased by the source side injection. Thus, the backward read mode should be applied in order to selectively read only the SONOS cell transistor erased by the source and drain sides injection. This third erase mode enables turning off the SONOS cell transistors erased by the source side injection, while selectively turning on the SONOS cell transistor erased by the source and drain sides injection.

In the third embodiment, the second erasure voltage $V_{E2}$ can be applied to all of the bit lines. In this case, all SONOS cell transistors $C_j$ connected to the selected word line $WL_j$ are erased by the source and drain sides injection. That is, a page erasing operation is performed. Thus, in the event that the page erasing operation is performed through the source and drain sides injection, a read operation can be achieved using either the backward read mode or the forward read mode.

According to the erasing operations described in the first, second, and third embodiments of the present invention, it is impossible to simultaneously erase all cell transistors in one block. Thus, embodiments of the present invention additionally provide methods of simultaneously erasing all cell transistors in the block, and selectively programming at least one cell transistor out of the erased cell transistors in the block or all cell transistors connected to one word line. The erase methods, which are described hereinafter, correspond to the programming methods explained in the first to third embodiments of the invention, and the programming methods, which are described hereinafter, correspond to the erase methods explained in the first to third embodiments of the invention.

First, for the block erase methods, the cell program methods and the page program methods are summarized in the following Table 2.

TABLE 2

| | | Erase | Program 1 | Read 1 | Program 2 | Read 2 |
|---|---|---|---|---|---|---|
| | SSL | 0 V or Vcc | $V_{PASS}$ | 3–6 V | $V_{PASS}$ (0 V) | 3–6 V |
| BL | Selected | 0 V | $V_{PGM2}$ | 0 V | Float (0 V) | $V_{R2}$ |
| | Non-selected | | Float | | | |
| WL | Selected | VE | $V_{PGM1}$ | $V_{R1}$ | $V_{PGM1}$ | $V_{R1}$ |
| | Non-selected | | $V_{PASS}$ | 3–6 V | $V_{PASS}$ | 3–6 V |
| | GSL | 0 V or Vcc | $V_{PASS}$ (0 V) | 3–6 V | $V_{PASS}$ | 3–6 V |
| | CSL | 0 V | Float (0 V) | $V_{R2}$ | $V_{PGM2}$ | 0 V |
| | SUB | 0 V | 0 V | 0 V | 0 V | 0 V |

Now, a block erase method according to the present invention will be explained with reference to FIG. 6 and the table 2.

The block erase method includes applying an erasure voltage $V_E$ to all word lines in one block and applying a ground voltage on the semiconductor substrate. The erasure voltage $V_E$ is identical or similar to the program voltage VPGM of Table 1. In addition, a ground voltage or a power supply voltage Vcc may be applied to the string selection line SSL and the ground selection line GSL. Also, a ground voltage may be applied to the common source line CSL. Thus, electrons are uniformly injected into charge trapping layers of all of the SONOS cell transistors in the block to increase threshold voltages of the SONOS cell transistors.

A method of selectively programming (Program 1 of Table 2) at least one cell transistor out of all of the cell transistors in the erased block is the same as the erasure method using the drain side injection method (Erase 1) explained in Table 1. Here, a first program voltage $V_{PGM1}$ applied to the selected word line and a second program voltage $V_{PGM2}$ applied to the selected bit line are identical to the first erasure voltage $V_{E1}$ and the second erasure voltage $V_{E2}$ explained in Table 1, respectively. Thus, a SONOS cell transistor A connected to the selected word line e.g., $WL_j$, and the selected bit line e.g., $BL_i$ is selectively programmed by the drain side injection. Unlike this, in the event that the second program voltage $V_{PGM2}$ is applied to all of the bit lines, all of the SONOS cell transistors A and B connected to the selected word line are programmed. That is, a page program operation is achieved.

A method of reading SONOS cell transistors programmed by the drain side injection (Read 1 of Table 2) is identical to the backward read mode (Read 1 of Table 1) explained in Table 1. Thus, explanations to the reading method are omitted.

Subsequently, a method of selectively programming all of the cell transistors connected to one word line selected from all word lines in the erased block (Program 2 of Table 2) is identical with the erasure method using the source side injection (Erase 2 of Table 1) explained with reference to Table 1. Here, a first program voltage $V_{PGM12}$ applied to the selected word line and a second program voltage $V_{PGM2}$ applied to the common source line CSL are identical to the first erasure voltage $V_{E1}$ and the second erasure voltage $V_{E2}$ explained in Table 1, respectively. Accordingly, all of the SONOS cell transistors A and B connected to the selected word line (for example, $WL_j$) are selectively programmed by the source side injection. That is, a page program operation is performed.

A method of reading SONOS cell transistors programmed by the source side injection (Read 2 of Table 2) is identical with the reading method using the forward read mode (Read 2 of Table 1) explained in Table 1. Thus, explanations with respect to the reading method are omitted.

According to the present invention as described above, it is possible to successfully program and erase a NAND-type SONOS non-volatile memory device having a thick tunnel oxide layer with a thickness of 20 Å or more using the F-N tunneling and channel hot holes. Also, a cell transistor erased by the channel hot holes can be read out using the backward read mode or the forward read mode. Therefore, it is possible to fundamentally resolve a weak bake retention characteristic, which is due to the tunnel oxide layer that is thinner than 20 Å.

What is claimed is:

1. An operation method of programming, erasing and reading a silicon-oxide-nitride-oxide-silicon (SONOS) cell transistor having a source region and a drain region that are formed to be spaced apart from each other in a semiconductor substrate, a tunnel oxide layer on a channel region between the source region and the drain region, and a charge trapping layer, a blocking oxide layer and a gate electrode that are sequentially stacked on the tunnel oxide layer, the erase method comprising:

applying a ground voltage to the semiconductor substrate;

applying a first erasure voltage to the gate electrode, the first erasure voltage being lower than the ground voltage; and applying a second erasure voltage to at least one of the drain region and the source region, the second erasure voltage equal to or higher than the ground voltage.

2. The operation method as claimed in claim 1, wherein the blocking oxide layer has a thickness of 50 Å to 80 Å.

3. The operation method as claimed in claim 1, wherein the tunnel oxide layer is thicker than 20 Å and thinner than the blocking oxide layer.

4. The operation method as claimed in claim 1, wherein the charge trapping layer comprises a silicon nitride layer.

5. The operation method as claimed in claim 1, wherein the first erasure voltage is −4 volts to −10 volts.

6. The operation method as claimed in claim 1, wherein the second erasure voltage is higher than 0 volts and lower than 8 volts.

7. The operation method as claimed in claim 6, wherein the second erasure voltage is applied to the drain region and the source region is floating.

8. The operation method as claimed in claim 6, wherein the second erasure voltage is applied to the source region and the drain region is floating.

9. The operation method as claimed in claim 6, wherein the second erasure voltage is applied to the source region and to the drain region.

10. The operation method as claimed in claim 7, wherein the reading method comprises:
grounding the drain region and the semiconductor substrate;
applying a first read voltage to the gate electrode, the first read voltage being 0 volts to 2 volts; and
applying a second read voltage to the source region, the second read voltage being higher than 0 volts and lower than 1 volt.

11. The operation method as claimed in claim 8, wherein the reading method comprises:
grounding the source region and the semiconductor substrate;
applying a first read voltage to the gate electrode, the first read voltage being 0 volts to 2 volts; and
applying a second read voltage to the drain region, the second read voltage being higher than 0 volts and lower than 1 volt.

12. The operation method as claimed in claim 1, wherein the programming method comprises:
applying the ground voltage to the semiconductor substrate, the source region and the drain region; and
applying a program voltage of between 10 and 20 volts to the gate electrode in order to inject electrons into the charge trapping layer.

13. An operation method of programming, erasing and reading a SONOS non-volatile memory device having a plurality of NAND-type strings which are two-dimensionally arranged on a semiconductor substrate, wherein each of the NAND-type strings has a string selection transistor, a plurality of SONOS cell transistors and a ground selection transistor that are connected in series, a drain region of the string selection transistor connected to a bit line, a source region of the ground selection transistor connected to a common source line, a gate electrode of the string selection transistor connected to a string selection line, gate electrodes of the plurality of SONOS cell transistors respectively connected to a plurality of word lines, and a gate electrode of the ground selection transistor connected to a ground selection line; the erase method comprising:

applying a ground voltage to the semiconductor substrate;
applying a first erasure voltage to one selected out of the plurality of word lines, the first erasure voltage being a negative voltage lower than the ground voltage;
applying a second erasure voltage to at least one selected out of the plurality of bit lines to select at least one SONOS cell transistor connected to the selected at least one bit line and the selected word line, the second erasure voltage being the ground voltage or a positive voltage higher than the ground voltage; and
turning on the SONOS cell transistors connected to unselected word lines out of the plurality of word lines and the string selection transistors to apply the second erasure voltage to a drain region of the selected at least one SONOS cell transistor.

14. The operation method as claimed in claim 13, wherein the first erasure voltage is −4 volts to −10 volts.

15. The operation method as claimed in claim 13, wherein the second erasure voltage is higher than 0 volts and lower than 8 volts.

16. The operation method as claimed in claim 13, wherein turning on the SONOS cell transistors connected to the unselected word lines and the string selection transistors comprises applying a pass voltage higher than 0 volts to the string selection line and the unselected word lines.

17. The operation method as claimed in claim 16, wherein the pass voltage is 5 volts to 8 volts.

18. The operation method as claimed in claim 13, further comprising turning off the ground selection transistors to electrically float a source region of the selected at least one SONOS cell transistor.

19. The operation method as claimed in claim 18, wherein turning off the ground selection transistors comprises applying the ground voltage to the ground selection line.

20. The operation method as claimed in claim 13, further comprising:
turning on the ground selection transistors; and
causing the common source line to float in order to float a source region of the selected at least one SONOS cell transistor.

21. The operation method as claimed in claim 20, wherein turning on the ground selection transistors comprises applying a pass voltage higher than 0 volts to the ground selection line.

22. The operation method as claimed in claim 13, wherein the reading method comprises:
applying the ground voltage to the semiconductor substrate;
applying the ground voltage to at least one selected of the plurality of bit lines;
applying a first read voltage to one selected out of the plurality of word lines, the first read voltage being 0 volts to 2 volts;
turning on the ground selection transistors, the string selection transistors, and the SONOS cell transistors connected to the unselected word lines out of the plurality of word lines; and
applying a second read voltage to the common source line, the second read voltage higher than the ground voltage.

23. The operation method as claimed in claim 22, wherein turning on the ground selection transistors, the string selection transistors, and the SONOS cell transistors connected to the unselected word lines comprises applying a voltage of 3 volts to 6 volts to the unselected word lines, the string selection line and the ground selection line.

24. The operation method as claimed in claim 22, wherein the second read voltage is higher than the ground voltage and lower than 1 volt.

25. An operation method of programming, erasing and reading a SONOS non-volatile memory device having a plurality of NAND-type strings which are two-dimensionally arranged on a semiconductor substrate, wherein each of the NAND-type strings has a string selection transistor, a plurality of SONOS cell transistors and a ground selection transistor that are connected in series, a drain region of the string selection transistor connected to a bit line, a source region of the ground selection transistor connected to a common source line, a gate electrode of the string selection transistor connected to a string selection line, gate electrodes of the plurality of SONOS cell transistors respectively connected to a plurality of word lines, and a gate electrode of the ground selection transistor connected to a ground selection line; the erase method comprising:

applying a ground voltage to the semiconductor substrate;

applying a first erasure voltage to one selected out of the plurality of word lines, the first erasure voltage being a negative voltage lower than the ground voltage;

applying a second erasure voltage to the common source line to select SONOS cell transistors connected to the selected word line and the common source line, the second erasure voltage being the ground voltage or a positive voltage higher than the ground voltage; and turning on the SONOS cell transistors connected to unselected word lines out of the plurality of word lines and the ground selection transistors to apply the second erasure voltage to source regions of the selected SONOS cell transistors.

26. The operation method as claimed in claim 25, wherein the first erasure voltage is −4 volts to −10 volts.

27. The operation method as claimed in claim 25, wherein the second erasure voltage is higher than 0 volts and lower than 8 volts.

28. The operation method as claimed in claim 25, wherein turning on the SONOS cell transistors connected to the unselected word lines and the ground selection transistors comprises applying a pass voltage higher than 0 volts to the ground selection line and the unselected word lines.

29. The operation method as claimed in claim 28, wherein the pass voltage is 5 volts to 8 volts.

30. The operation method as claimed in claim 25, further comprising turning off the string selection transistors to electrically float drain regions of the selected SONOS cell transistors.

31. The operation method as claimed in claim 30, wherein turning off the string selection transistors comprises applying the ground voltage to the string selection line.

32. The operation method as claimed in claim 25, further comprising:

turning on the string selection transistors; and causing the bit lines to electrically float in order to float drain regions of the selected SONOS cell transistors.

33. The operation method as claimed in claim 32, wherein turning on the string selection transistors comprises applying a pass voltage higher than 0 volts to the string selection line.

34. The operation method as claimed in claim 25, wherein the reading method comprises:

applying the ground voltage to the semiconductor substrate and the common source line;

applying a first read voltage to one selected out of the plurality of word lines, the first read voltage being 0 volts to 2 volts;

turning on the ground selection transistors, the string selection transistors, and SONOS cell transistors connected to unselected word lines out of the plurality of word lines; and applying a second read voltage higher than the ground voltage to one selected out of the plurality of bit lines.

35. The operation method as claimed in claim 34, wherein turning on the ground selection transistors, the string selection transistors, and SONOS cell transistors connected to the unselected word lines comprises applying a voltage of 3 volts to 6 volts to the unselected word lines, the string selection lines and the ground selection line.

36. The operation method as claimed in claim 34, wherein the second read voltage is higher than the ground voltage and lower than 1 volt.

37. An operation method of programming, erasing and reading a SONOS non-volatile memory device having a plurality of NAND-type strings which are two-dimensionally arranged on a semiconductor substrate, wherein each of the NAND-type strings has a string selection transistor, a plurality of SONOS cell transistors and a ground selection transistor that are connected in series, a drain region of the string selection transistor connected to a bit line, a source region of the ground selection transistor connected to a common source line, a gate electrode of the string selection transistor connected to a string selection line, gate electrodes of the SONOS cell transistors respectively connected to a plurality of word lines and a gate electrode of the ground selection transistor connected to a ground selection line; the erase method comprising:

applying a ground voltage to the semiconductor substrate;

applying a first erasure voltage to one selected out of the plurality of word lines, the first erasure voltage being a negative voltage lower than the ground voltage;

applying a second erasure voltage to the common source line and at least one selected out of the plurality of bit lines, the second erasure voltage being the ground voltage or a positive voltage higher than the ground voltage;

turning on SONOS cell transistors connected to unselected word lines out of the plurality of word lines; and turning on the string selection transistors and the ground selection transistors.

38. The operation method as claimed in claim 37, wherein the first erasure voltage is −4 volts to −10 volts.

39. The operation method as claimed in claim 37, wherein the second erasure voltage is higher than 0 volts and lower than 8 volts.

40. The operation method as claimed in claim 37, wherein turning on the ground selection transistors, the string selection transistors, and the SONOS cell transistors connected to the unselected word lines comprises applying a pass voltage higher than 0 volts to the string selection line, the ground selection line and the unselected word lines.

41. The operation method as claimed in claim 40, wherein the pass voltage is 5 volts to 8 volts.

42. An operation method of programming, erasing and reading a SONOS non-volatile memory device having a plurality of NAND-type strings which are two-dimensionally arranged on a semiconductor substrate, wherein each of the NAND-type strings has a string selection transistor, a plurality of SONOS cell transistors and a ground selection transistor that are connected in series, a drain region of the string selection transistor connected to a bit line, a source region of the ground selection transistor connected to a common source line, a gate electrode of the string selection transistor connected to a string selection line, gate electrodes of the SONOS cell transistors respectively connected to a plurality of word lines and a gate electrode of the ground selection transistor is connected to a ground selection line; the programming method comprising:

applying a ground voltage to the semiconductor substrate;

applying a first program voltage to one selected out of the plurality of word lines, the first program voltage being a negative voltage lower than the ground voltage;

applying a second program voltage to at least one selected out of the plurality of bit lines to select at least one SONOS cell transistor connected to the selected at least one bit line and the selected word line, the second program voltage being the ground voltage or a positive voltage higher than the ground voltage; and turning on the SONOS cell transistors connected to the unselected word lines out of the plurality of word lines and string selection transistors to apply the second program voltage to a drain region of the selected at least one SONOS cell transistor.

43. The operation method as claimed in claim 42, wherein the first program voltage is −4 volts to −10 volts.

44. The operation method as claimed in claim 42, wherein the second program voltage is higher than 0 volts and lower than 8 volts.

45. The operation method as claimed in claim 42, wherein turning on the string selection transistors and the SONOS cell transistors connected to the unselected word lines comprises applying a pass voltage higher than 0 volts to the string selection line and the unselected word lines.

46. The operation method as claimed in claim 45, wherein the pass voltage is 5 volts to 8 volts.

47. The operation method as claimed in claim 42, further comprising turning off the ground selection transistors to cause a source region of the selected at least one SONOS cell transistor to electrically float.

48. The operation method as claimed in claim 47, wherein turning off the ground selection transistors comprises applying the ground voltage on the ground selection line.

49. The operation method as claimed in claim 42, further comprising:

turning on the ground selection transistors; and causing the common source line to float in order to float a source region of the selected at least one SONOS cell transistor.

50. The operation method as claimed in claim 49, wherein turning on the ground selection transistors comprises applying a pass voltage higher than 0 volts to the ground selection line.

51. The operation method as claimed in claim 42, wherein the erasing method comprises:

applying the ground voltage to the semiconductor substrate; and applying an erasure voltage to the plurality of word lines to erase data stored in all SONOS cell transistors in a block composed of the plurality of NAND-type strings, the erasure voltage being 10 volts to 20 volts.

52. The operation method as claimed in claim 42, wherein the reading method comprising:

applying the ground voltage to the semiconductor substrate;

applying the ground voltage to at least one selected out of the plurality of bit lines;

applying a first read voltage to one selected out of the plurality of word lines, the first read voltage being between 0 volts and 2 volts;

turning on the ground selection transistors, the string selection transistors, and the SONOS cell transistors connected to unselected word lines out of the plurality of word lines; and applying a second read voltage that is higher than the ground voltage to the common source line.

53. The operation method as claimed in claim 52, wherein turning on the ground selection transistors, the string selection transistors, and the SONOS cell transistors connected to the unselected word lines comprises applying a voltage of between 3 to 6 volts to the unselected word lines, the string selection line and the ground selection line.

54. The operation method as claimed in claim 52, wherein the second read voltage is higher than the ground voltage and lower than 1 volt.

55. An operation method of programming, erasing and reading a SONOS non-volatile memory device having a plurality of NAND-type strings which are two-dimensionally arranged on a semiconductor substrate, wherein each of the NAND-type strings has a string selection transistor, a plurality of SONOS cell transistors and a ground selection transistor that are connected in series, a drain region of the string selection transistor connected to a bit line, a source region of the ground selection transistor connected to a common source line, a gate electrode of the string selection transistor connected to a string selection line, gate electrodes of the SONOS cell transistors respectively connected to a plurality of word lines, and a gate electrode of the ground selection transistor connected to a ground selection line; the programming method comprising:

applying a ground voltage to the semiconductor substrate;

applying a first program voltage to one selected out of the plurality of word lines, the first program voltage being a negative voltage lower than the ground voltage;

applying a second program voltage to the common source line and to at least one selected out of the plurality of bit lines, the second program voltage being the ground voltage or a positive voltage higher than the ground voltage;

turning on the SONOS cell transistors connected to unselected word lines out of the plurality of word lines; and turning on the ground selection transistors and the string selection transistors.

56. The operation method as claimed in claim 55, wherein the first program voltage is −4 volts to −10 volts.

57. The operation method as claimed in claim 55, wherein the second program voltage is higher than 0 volts and lower than 8 volts.

58. The operation method as claimed in claim 55, wherein turning on the ground selection transistors, the string selection transistors and the SONOS cell transistors connected to the unselected word lines comprises applying a pass voltage higher than 0 volts to the ground selection line, the string selection line and the unselected word lines.

59. The operation method as claimed in claim 58, wherein the pass voltage is 5 volts to 8 volts.

* * * * *

UNITED STATES PATENT AND TRADEMARK OFFICE
CERTIFICATE OF CORRECTION

PATENT NO. : 6,894,924 B2  
APPLICATION NO. : 10/133684  
DATED : May 17, 2005  
INVENTOR(S) : Choi et al.

Page 1 of 1

It is certified that error appears in the above-identified patent and that said Letters Patent is hereby corrected as shown below:

On the cover sheet, item 56, under U.S. Patent Documents, please add --US 5,768,192--  
At column 11, line 35, please replace "BLj" with --BLi--  
At column 11, line 36, please replace "BLj+1" with --BLi+1--

Signed and Sealed this

Thirtieth Day of January, 2007

JON W. DUDAS  
*Director of the United States Patent and Trademark Office*